Figure 1:
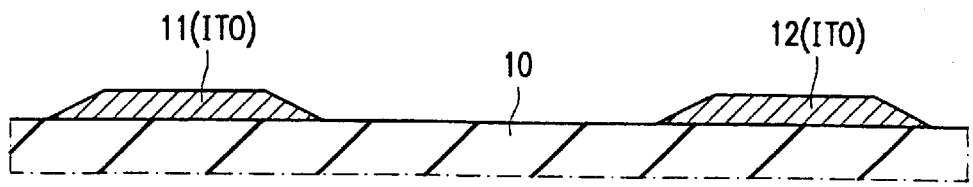

United States Patent
French et al.

[11] Patent Number: 5,981,317
[45] Date of Patent: Nov. 9, 1999

[54] METHOD OF FABRICATING A THIN FILM TRANSISTOR

[75] Inventors: Ian D. French, Hove; Martin J. Powell, Horley, both of United Kingdom

[73] Assignee: U.S. Philips Corporation, New York, N.Y.

[21] Appl. No.: 08/986,555

[22] Filed: Dec. 8, 1997

[30] Foreign Application Priority Data

Dec. 19, 1996 [GB] United Kingdom ................... 9626344

[51] Int. Cl.$^6$ ................................................ H01L 21/336
[52] U.S. Cl. ............................................................ 438/161
[58] Field of Search ................................... 438/161, 300,
438/660, 663, 664, 682, 683, 649, 655,
151, FOR 155, FOR 356, FOR 360, FOR 352

[56] References Cited

U.S. PATENT DOCUMENTS

| | | | |
|---|---|---|---|
| 4,426,407 | 1/1984 | Morin et al. | 438/161 |
| 5,130,829 | 7/1992 | Shannon . | |
| 5,252,502 | 10/1993 | Havemann | 437/41 |
| 5,300,449 | 4/1994 | Okumura . | |
| 5,396,083 | 3/1995 | Kim et al. | 257/59 |
| 5,407,837 | 4/1995 | Eklund | 438/151 |
| 5,585,647 | 12/1996 | Nakajima et al. | 257/72 |
| 5,698,869 | 12/1997 | Yoshimi et al. | 257/66 |
| 5,773,329 | 6/1998 | Kuo | 438/162 |
| 5,807,770 | 9/1998 | Mineji | 438/151 |
| 5,841,173 | 11/1998 | Yamashita | 257/384 |
| 5,904,512 | 5/1999 | Chang et al. | 438/158 |

FOREIGN PATENT DOCUMENTS

0221361A1 5/1987 European Pat. Off. ........ G02F 1/133
0 456 059 A1 11/1991 European Pat. Off. .

OTHER PUBLICATIONS

"An Ohmic Contact Formation Method for Fabricating a–Si TFT's on Large Size Substrate" by T. Yukawa, et al published in Pro. of the 9th Int'l Display Research Conf., Oct. 16–18, 1989, Kyoto Japan, Japan Display '89, pp. 506–509.

"A Completely Self–Aligned a–Si TFT", M. Akiyama, et al, SID '93 Digest paper 40.2, pp. 887–889.

Primary Examiner—Mary Wilczewski
Attorney, Agent, or Firm—Brian J. Wieghaus

[57] ABSTRACT

In the manufacture of a flat panel display or other large-area electronics device, a self-aligned thin-film transistor (TFT) is formed with source and drain silicide parts (31,32) adjacent an insulated gate structure (25,21,22) on a silicon film (20) which provides a transistor body (20a) comprising a channel area (20b) of the transistor. The transistor has its source and drain electrode pattern (11,12) extending under the silicon film (20). The insulated gate structure (25,21,22) is formed as a conductive gate (25) on an insulating film (21,22) which is patterned together with the conductive gate (25). A silicide-forming metal (30) is deposited over the insulated gate structure (25,21,22) and over exposed, adjacent areas (20c and 20d) of the silicon film, and the metal is reacted to form the silicide (31,32) with these adjacent areas of the silicon film. The unreacted metal is removed from the insulated gate structure (25,21,22) by means of a selective etchant to leave the source and drain silicide parts (31 and 32) self-aligned with the conductive gate (25). An electrical connection (n+; 31,32) is formed across the thickness of the silicon film (20) between the source and drain electrode pattern (11,12) and the respective source and drain silicide parts (31 and 32).

14 Claims, 3 Drawing Sheets

METHOD OF FABRICATING A THIN FILM TRANSISTOR

This invention relates to methods of manufacturing electronic devices comprising a thin-film transistor (hereinafter termed TFT), particularly but not exclusively a hydrogenated amorphous silicon (a-Si:H) fully self-aligned (FSA) top-gate TFT. The device may be a flat panel display (for example, an active-matrix liquid-crystal display), or another type of large-area electronic device (for example, a large-area image sensor, or a thin-film data store or memory device). The invention also relates to such devices manufactured by these methods.

There is much interest in developing thin-film circuit devices with TFTs and/or other thin-film semiconductor circuit elements on insulating substrates for large-area electronics applications. These circuit elements fabricated with portions of an amorphous or polycrystalline semiconductor film may form the switching elements in a cell matrix, for example in a flat panel display as described in United States Patent Specification U.S. Pat. No. 5,130,829 (our reference PHB 33646), the whole contents of which are hereby incorporated herein as reference material. Both top-gate and bottom-gate TFTs are disclosed in U.S. Pat. No. 5,130,829.

United States Patent Specification U.S. Pat. No. 5,300,449 discloses a method of manufacturing an electronic device comprising a TFT, comprising the steps of:

(a) forming a source and drain electrode pattern on a substrate, (b) depositing a silicon film on the source and drain electrode pattern to provide a transistor body comprising a channel area of the transistor, (c) forming an insulated gate structure on the channel area of the silicon film, (d) depositing a silicide-forming metal over the insulated gate structure and over exposed, adjacent areas of the silicon film, and (e) reacting the metal to form a silicide with said adjacent areas of the silicon film.

The whole contents of U.S. Pat. No. 5,300,449 are hereby incorporated herein as reference material. In the top-gate TFT process as disclosed in U.S. Pat. No. 5,300,449, the silicide is formed over the silicon film to provide primarily the transparent pixel electrodes of an active matrix display, instead of using ITO (indium tin oxide) for these pixel electrodes. The TFTs form the switching elements of the display matrix.

According to the present invention, there is provided a method of manufacturing an electronic device comprising a thin-film transistor, comprising the steps of:

(a) forming a source and drain electrode pattern on a substrate, (b) depositing a silicon film on the source and drain electrode pattern to provide a transistor body comprising a channel area of the transistor, (c) forming an insulated gate structure on the channel area of the silicon film, (d) depositing a silicide-forming metal over the insulated gate structure and over exposed, adjacent areas of the silicon film, and (e) reacting the metal to form a silicide with said adjacent areas of the silicon film, the method being characterised in that the insulated gate structure is formed in step (c) as a conductive gate on an insulating film which is patterned together with the conductive gate, the unreacted metal is removed from the insulated gate structure after step (e) by means of a selective etchant to leave, at said adjacent areas, source and drain silicide parts which are self-aligned with the conductive gate, and an electrical connection is formed across the thickness of the silicon film between the source and drain electrode pattern and the respective source and drain silicide parts.

Thus, the present invention permits the fabrication of a self-aligned top-gate TFT using metal silicide to reduce contact resistance, and provides a method permitting the production of fully self-aligned (FSA) top-gate silicon TFTs, even when there is a lateral spacing between the conductive gate and the source and drain electrode pattern. The source-drain contact resistance is reduced by the metal silicide formed at the top surface of the silicon semiconductor film (which may be of, for example, a-Si:H), and this silicide is self-aligned with the conductive gate of the TFT.

There is considerable interest in improving the performance of amorphous silicon TFTs, especially to make them suitable for active-matrix addressing of large, high resolution displays. Two features of particular significance are the reduction of the gate line resistivity and the use of a fully self-aligned TFT structure. The fully self-aligned TFT reduces the parasitic source-drain capacitance and improves the large area uniformity of the residual capacitance. In addition to displays, the advantage of a fully self-aligned TFT is even greater for matrix-addressed image sensors.

There have been several proposals published for fabricating a fully self-aligned bottom-gate TFT, for example the SID 93 Digest paper 40.2 (page 887–889) "A completely self-aligned a-Si TFT" by M. Akiyama et. al, the whole contents of which are hereby incorporated herein as reference material. This SID 93 paper discloses the use of source and drain silicide parts for the bottom-gate TFT.

The present invention provides an advantageous top-gate structure. Compared to a bottom-gate TFT, an important advantage of a top-gate TFT is the ease with which a low resistance gate line can be made with a highly conductive top-gate metal such as aluminium. The ability to also have a fully self-aligned structure in a top-gate TFT opens up the prospect of combining these advantages, for large area electronics applications. The method according to the invention may simply comprise only one self-alignment step, as opposed to two self-alignment steps as used for a bottom-gate fully self-aligned TFT structure.

The electrical connection between the source and drain electrode pattern and the respective source and drain silicide parts can be formed in various ways so as to have a resistance less than that through the silicon film material which provides the channel area. Most simply, an extension of the silicide itself and/or local doping across the thickness of the silicon film is preferably used to provide this electrical connection.

Thus, the regions of the silicon film between the source and drain electrode pattern and the respective source and drain silicide parts may be doped with conductivity type dopant to provide at least a part of the electrical connection across the thickness of the silicon film. The insulated gate structure may be used as a mask (for example, an implantation mask) while introducing said conductivity type dopant into the regions of the silicon film between the source and drain electrode pattern and the respective source and drain silicide parts. Thus, the doped regions can be self-aligned with the conductive gate, while preventing dopant contamination of the channel area. Plasma doping or ion implantation may be used. Dopant ions may be implanted through the silicide-forming metal between steps (d) and (e), and/or through the source and drain silicide parts after removing the unreacted metal after step (e). In another form, the regions of the silicon film between the source and drain electrode pattern and the respective source and drain silicide parts may be doped with the conductivity type dopant from the source and drain electrode pattern.

The source and drain electrode pattern may be exposed at ends of the transistor body, and the source and drain silicide parts may extend over these ends to contact the source and drain electrode pattern and so to form at least a part of the electrical connection across the thickness of the silicon film. The ends of the transistor body may be tapered. Tapering these ends facilitates continuity in the metal film deposited in step (d) and hence continuity in an extension of the source and drain silicide parts over the ends from the top surface to the bottom source and drain electrode pattern.

Figure 6:
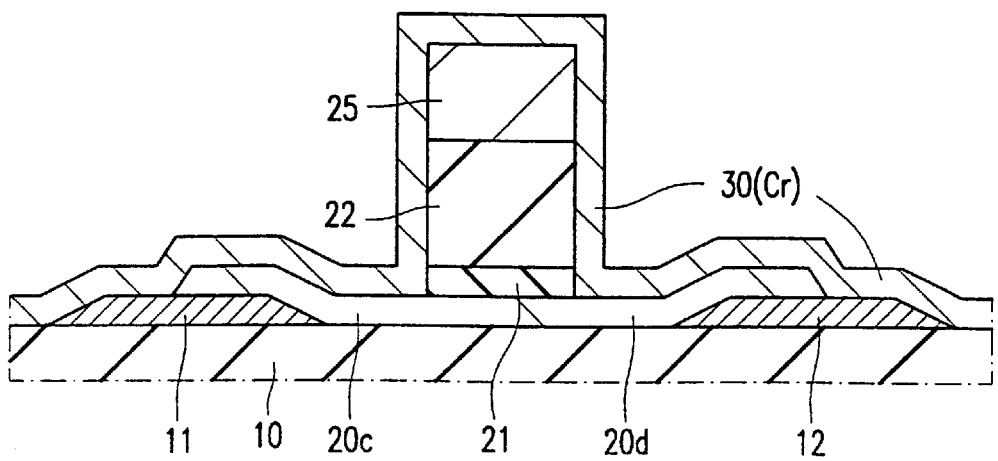
Figure 7:
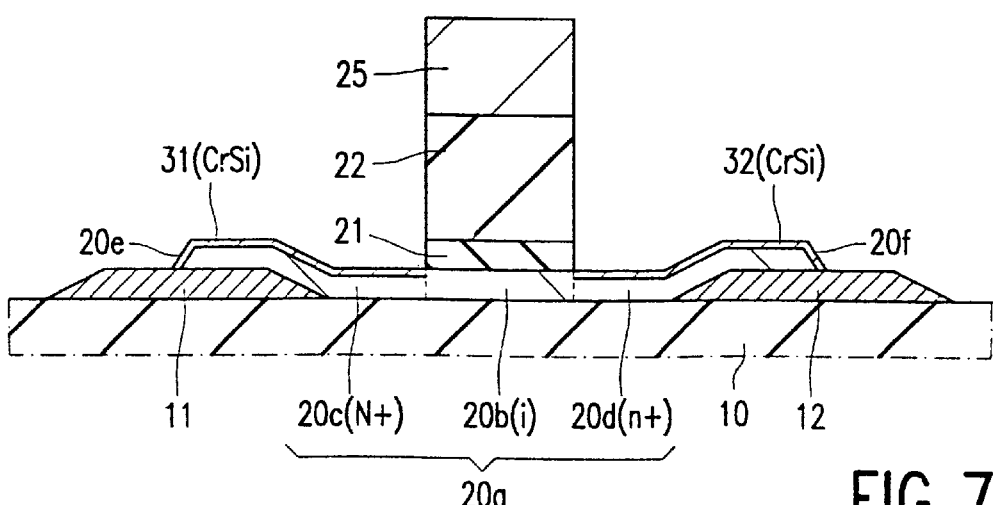
Figure 8:
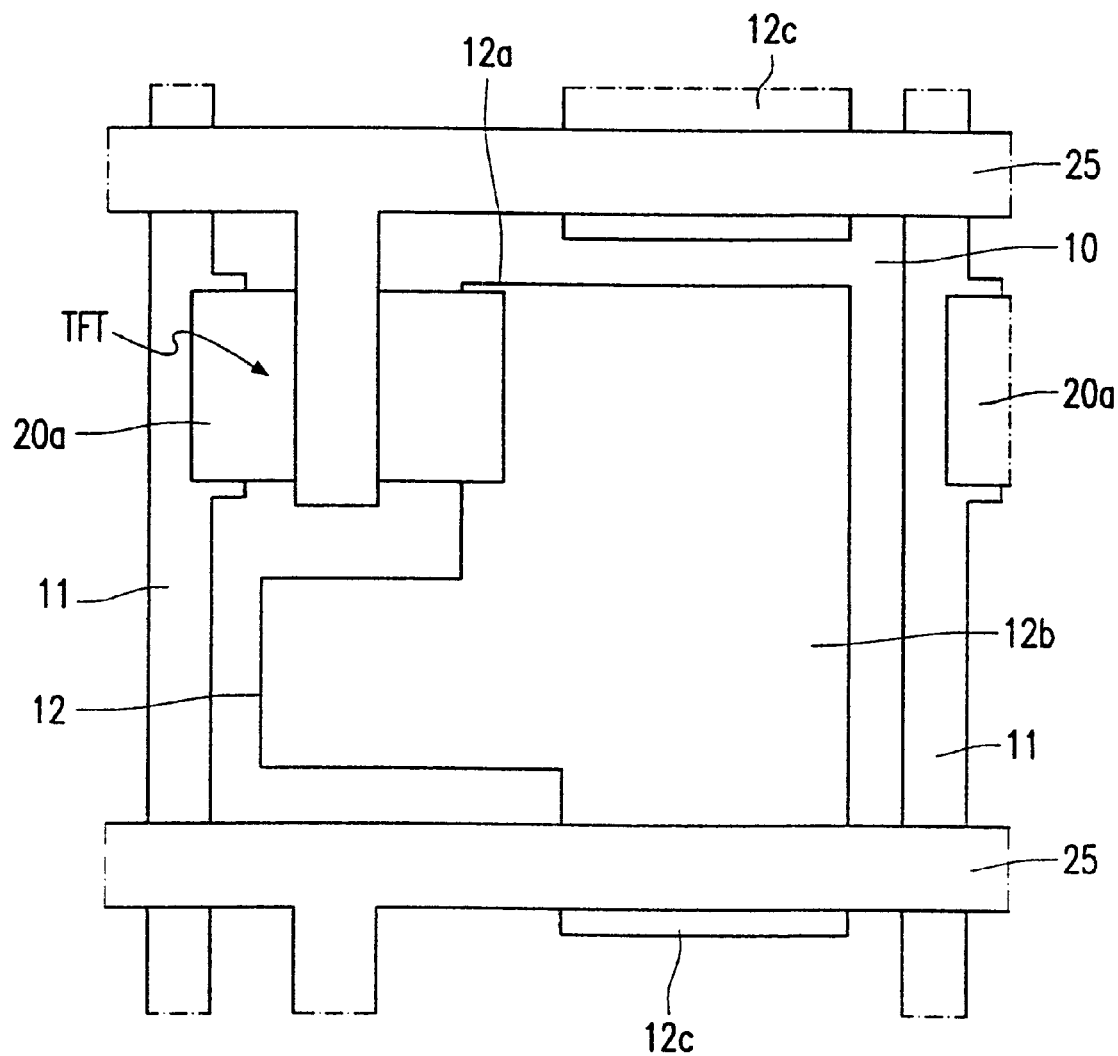

Particular features in accordance with the present invention are illustrated specifically in embodiments of the invention, by way of example, with reference to the accompanying process flow chart and diagrammatic drawings, in which:

FIGS. 1 to 7 are cross-sectional views of a FSA top-gate TFT of a large-area electronic device at stages in its manufacture by a method in accordance with the present invention; and FIG. 8 is a plan view of a cell layout of an AMLCD device, having as its switching element a FSA top-gate TFT manufactured by such a method in accordance with the present invention.

It should be noted that these Figures are diagrammatic and not drawn to scale. Relative dimensions and proportions of parts of these Figures have been shown exaggerated or reduced in size, for the sake of clarity and convenience in the drawings.

Such FSA top-gate TFTs manufactured in accordance with the invention may form the switching elements of a display matrix (or other large-area electronic device), for example, as disclosed in the SID 93 Digest paper and/or U.S. Pat. No. 5,130,829 (FIG. 1) and/or U.S. Pat. No. 5,300,449. By way of example, FIG. 9 shows the whole area of one cell of an active switching matrix of a flat panel display manufactured in accordance with the invention. The cell comprises an electrode pattern 11 and 12 of, for example, ITO formed on an insulating substrate 10. The substrate 10 may comprise a back plate of the display, for example a glass plate or a polymer film. Column conductors 11 of the pattern 11,12 form common source lines of the switching TFTs in the matrix columns. Another part 12a of the pattern 11,12 forms a drain electrode of the TFT. In this particular exemplary embodiment, the bulk of part 12 of the pattern 11,12 forms a pixel electrode 12b. This pixel electrode 12b is integral with the drain electrode part 12a and also, in this example, with a part 12c which forms the bottom electrode of a pixel storage-capacitor with a row conductor 25 of a neighbouring cell. The row conductors 25 form common gate lines of the TFTs in the matrix rows. The switching TFT of each cell comprises a silicon transistor body 20a. In the example of FIG. 9 these bodies 20a are in the form of separate islands of a silicon film pattern. Typically the silicon film 20 is of, for example, a-Si:H. However, rather than amorphous silicon, polycrystalline silicon may be preferred for some displays and/or other large-area electronic devices.

FIGS. 1 to 7 show an example process for a fully self-aligned top gate TFT in accordance with the present invention. The process comprises the steps of:

(a) forming the source and drain electrode pattern 11,12 on the substrate 10 (FIG. 1), (b) depositing a silicon film 20 on the source and drain electrode pattern 11,12 to provide the transistor body 20a comprising a channel area 20b of the TFT (FIGS. 2 and 7), (c) forming an insulated gate structure 25,22,21 on the channel area 20b of the silicon film 20 (FIGS. 2 to 5), (d) depositing a silicide-forming metal 30 over the insulated gate structure 25,22,21 and over exposed, adjacent areas 20c,20d of the silicon film 20 (FIG. 6), and (e) reacting the metal 30 to form a silicide 31,32 with said adjacent areas 20c,20d of the silicon film 20 (FIG. 7).

In this method in accordance with the present invention, the insulated gate structure 25,22,21 is formed in step (c) as a conductive gate 25 on an insulating film 22,21 which is patterned together with the conductive gate 25; and the unreacted metal is removed from the insulated gate structure 25,22,21 after step (e) by means of a selective etchant to leave, at said adjacent areas 20c,20d, source and drain silicide parts 31 and 32 respectively which are self-aligned with the conductive gate 25. Furthermore (for example, by doping the areas 20c and 20d and/or by extension of the silicide 31,32 over the ends of the transistor body 20a), an electrical connection is formed across the thickness of the silicon film 20 between the source and drain electrode pattern 11,12 and the respective source and drain silicide parts 31 and 32. Thus, although the channel area may composed of originally-deposited undoped a-Si:H with intrinsic conductivity (i), the areas 20c and 20d may be heavily doped (n+) with, for example, phosphorus or arsenic in the case of an n-channel TFT.

A two stage deposition of the gate insulator 21,22 is adopted in step (c) when it is desired not to have a-Si under the gate lines 25. A particularly advantageous feature is the use of ion-implantation or plasma doping together with metal (Cr) deposition and silicide formation (steps (d) and (e)), to reduce the contact resistance. Taper-etching of the a-Si:H island 20a as in FIG. 3 may also help in reducing contact resistance. The silicide layer 31,32 provides the lateral conduction from the source and drain electrodes 11 and 12 (e.g. ITO) to the channel 20b, and the n+ doping of adjacent areas 20c and 2d provides good injection into the TFT channel 20b.

Figure 2:
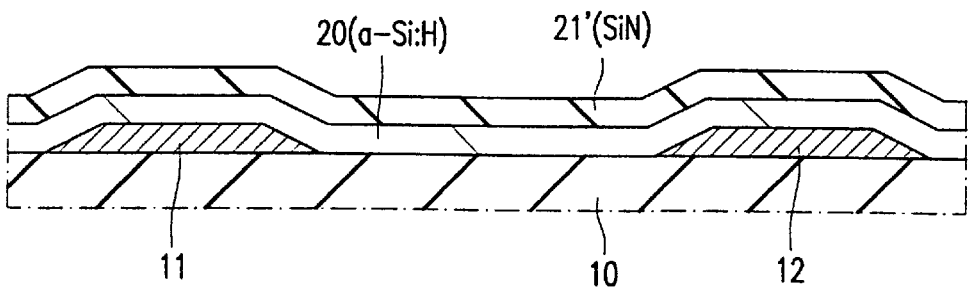
Figure 3:
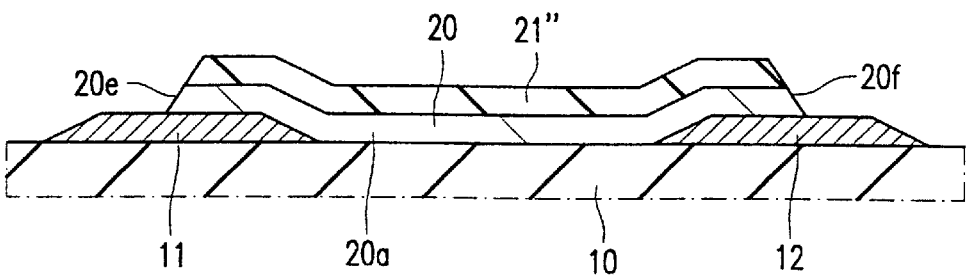

An advantageous sequence of processing steps is illustrated in FIGS. 1 to 7. Using known photolithographic and etching techniques, the electrode pattern 11,12 of FIG. 1 is formed from a film of electrode material deposited on the insulating substrate 10. The undoped silicon film 20 is then deposited, followed by a first insulating film 21' (for example of silicon nitride). The resulting structure is illustrated in FIG. 2. Using photolithographic and etching techniques, the films 20 and 21' are then patterned to form the transistor body 20a covered with an insulating film portion 21'. An etchant may be used which tapers the edge of the silicon film 20 so as to provide the transistor body 20a with tapered source and drain ends 20e and 20f. As illustrated in FIG. 3, the source and drain electrode pattern 11,12 is exposed at these ends 20e and 20f of the transistor body 20a.

Figure 4:
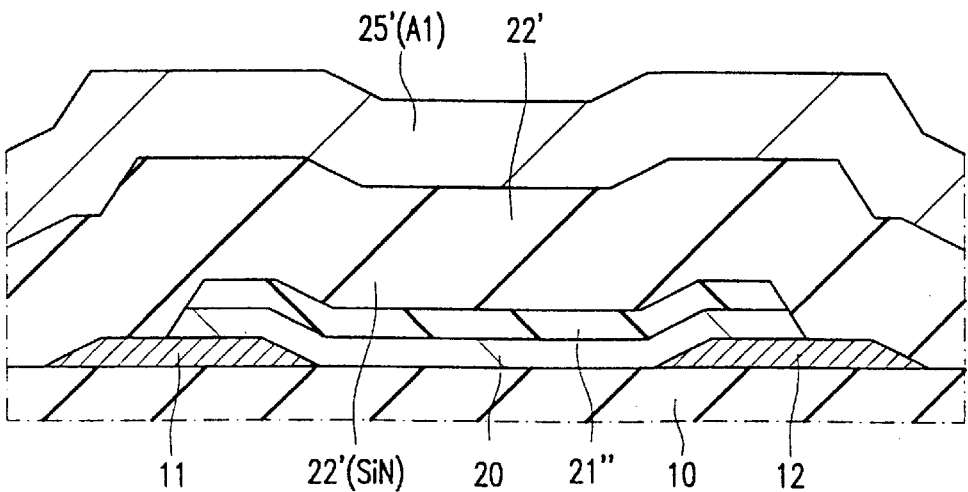
Figure 5:
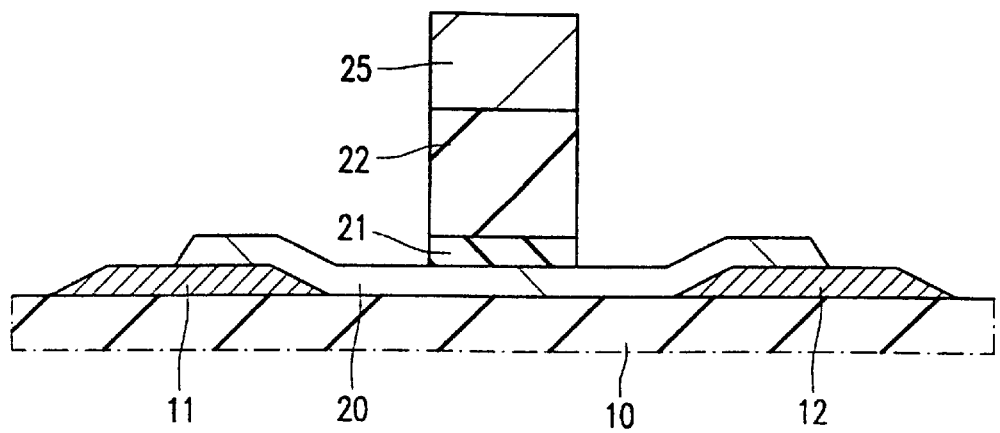

Two further films may now be deposited, for example, a second insulating film 22' (for example of silicon nitride) and a conductive gate film 25' (for example of aluminium). The resulting structure is illustrated in FIG. 4. By a photolithographic and etching technique, the films 25',22' and 21' are now patterned to form the insulated gate structure 25,22,21 of FIG. 5. Separate etchants may be used for the aluminium film 25' and the silicon nitride films 21' and 22'. However, the etching treatments for both materials use a common photolithographic mask on the aluminium film 25' to define the patterns of the conductive gate 25 and gate insulator 21,22. During the etching of the gate insulator 21,22, the overlying gate 25 may also act as a mask. Thus, the gate insulator 21,22 is patterned together with the gate 25. FIG. 5 illustrates the situation in which gate 25 and gate insulator 21,22 have identical patterns. However, the etching conditions may be such that the resulting gate insulator 21,22 has a similar pattern slightly wider than the gate 25.

As illustrated in FIG. 6, the silicide-forming metal (for example chromium) is now deposited. The resulting chromium film 30 extends over the insulated gate structure 25,22,21, and over the exposed, adjacent areas 20c and 20d of the transistor body 20a (including its ends 20e and 20f), and over the exposed areas of the electrode pattern 11,12 and the substrate 10. The thin film structure may now be heated to form the silicide areas 31 and 32 with the exposed silicon of the transistor body 20a. Subsequently a chromium etchant is used to remove the unreacted chromium and so to leave the silicide areas 31 and 32 in the TFT structure of FIG. 7. In this TFT structure, the source and drain silicide parts 31 and 32 extend over the ends 20e and 20f to contact the source and drain electrode pattern 11,12. The TFT may also have doped source and drain regions at the areas 20c and 20d, which also provide at least a part of the electrical connection across the thickness of the silicon film 20.

These doped source and drain regions 20c and 20d may be formed by plasma doping while, for example, using the top-gate structure 25,22,21 to mask the underlying (intrinsic) channel area 20b. Alternatively, doped source and drain regions 20c and 20d may be formed by ion implantation, for example using the top-gate structure 25,22, 21 as an implantation mask. This implantation may be carried out before depositing the silicide-forming metal, i.e between FIGS. 5 and 6. However, it proves particularly beneficial (in terms of process reliability and good silicide quality) to carry out any such implantation through the silicide-forming metal (i.e at the FIG. 6 stage) and/or the silicide.

In one form, ion-implantation (e.g. of dopant ions or ions of the silicide-forming metal) is carried out into the amorphous or polycrystalline silicon film 20 through the silicide-forming metal overlayer 30, in order to form a high quality silicide 31,32 with the metal, without the need for any annealing (heating) step.

In another form, the silicide 31,32 is formed with the amorphous or polycrystalline silicon film 20 by a heating step before the ion-implantation step in order to form a high quality silicide with the metal 30, and then ion-implantation (e.g. of the dopant ions or ions of the metal) is carried out into the amorphous or polycrystalline silicon 20 through the silicide overlayer 31,32, preferably after removing the unreacted siliciding metal.

Experimental work by the inventors has revealed that higher quality silicides can be formed in these ways on unimplanted material 20, than can be formed by siliciding previously-implanted material 20.

In the embodiments so far described, Cr has been used as a suitable silicide-forming metal. However, instead of Cr silicide, silicides of other metals may be used in methods and devices in accordance with the present invention, e.g. Mo, Ni, Pd, Pt, Au, and others.

When the TFT has doped source and drain regions, these doped regions may be formed by doping the silicon film 20 (e.g. during its deposition) from the bottom source and drain electrode pattern 11,12, for example as described in published European patent application EP-A-0 221 361 and the conference paper "An Ohmic Contact Formation Method for Fabricating α-Si TFTs on Large Size Substrates" by Yukawa et al published in Proceedings of the 9th International Display Research Conference, Oct. 16–18, 1989, Kyoto, Japan, Japan Display '89, pages 506–509. The whole contents of EP-A-0 221 361 and this Japan Display '89 paper are hereby incorporated herein as reference material. Thus, the source and drain may be doped from the bottom of the silicon film, instead of and/or in addition to from (or via) its top surface where the silicide film is formed.

Many other modifications and variations are possible within the scope of the present invention. Thus, although the TFT preferably includes doped source and drain regions (for example across the thickness of the film 20 at the areas 20c and 20d), such doped regions may be omitted. In this case, reliance is placed on the direct contact between the metal silicide parts 31 and 32 and the TFT channel 20b to give adequate injection. In practice, some degradation of performance may be expected as a result, but this modified structure (which is effectively converted into a co-planar TFT by the suicide parts 31 and 32) should still give sufficiently high ON current for an n-channel a-Si TFT. Thus, such a TFT is a majority carrier device, the leakage current of which is controlled by the bulk Fermi level of the silicon film 20. Although FIG. 3 illustrates tapered ends 20e and 20f for the transistor body 20a, these ends 20e and 20f may be formed without significant tapering. Where the exposed silicon at these non-tapered ends 20e and 20f is in contact with the deposited metal 30, silicide connections can still be formed from the top surface of the film 20 to the bottom electrode pattern 11 and 12. It is also possible to fabricate TFT structures in accordance with the present invention, in which the transistor body 20a is defined by etching after the silicide-forming step, in which case no silicide is formed on the ends 20e and 20f of the transistor body 20a. In this case, doped source and drain regions extending through the thickness of the silicon film in the areas 20c and 20d can electrically connect the source and drain silicide parts 31 and 32 (which are only at the top surface of the transistor body 20a) to the source and drain electrode pattern 11,12 at the bottom surface.

Other modifications and variations will be apparent to persons skilled in the art. Such modifications and variations may involve other features which are already known in the manufacture of active-matrix liquid-crystal displays and other large-area electronic devices, TFT and other thin-film circuit element design and circuitry, and other semiconductor devices, and which may be used instead of or in addition to features already disclosed herein. Although patent claims have been formulated in this application to particular combinations of features, it should be understood that the scope of the disclosure of the present application includes any and every novel feature or novel combination of features disclosed herein either explicitly or implicitly and together with all such modifications, variations and generalisations, whether or not relating to the main inventive concepts disclosed herein and whether or not it mitigates any or all of the same technical problems as the main inventive concepts. The applicants hereby give notice that patent claims may be formulated to such features and/or combinations of such features during prosecution of the present application or of any further application derived or claiming priority therefrom.

We claim:

1. A method of manufacturing an electronic device comprising a thin-film transistor, comprising the steps of:

(a) forming a source and drain electrode pattern on a substrate, (b) depositing a silicon film on the source and drain electrode pattern to provide a transistor body comprising a channel area of the transistor, (c) forming an insulated gate structure on the channel area of the silicon film, (d) depositing a silicide-forming metal over the insulated gate structure and over exposed, adjacent areas of the silicon film, and (e) reacting the metal to form a silicide with said adjacent areas of the silicon film, the method being characterised in that the insulated gate structure is formed in step (c) as a conductive gate on an insulating film which is patterned together with the conductive gate, the unreacted metal is removed from the insulated gate structure after step (e) by means of a selective etchant to leave, at said adjacent areas, source and drain silicide parts which are self-aligned with the conductive gate, and an electrical connection is formed across the thickness of the silicon film between the source and drain electrode pattern and the respective source and drain silicide parts.

2. A method as claimed in claim 1, further characterised in that the regions of the silicon film between the source and drain electrode pattern and the respective source and drain suicide parts are doped with conductivity type dopant to provide at least a part of the electrical connection across the thickness of the silicon film.

3. A method as claimed in claim 2, further characterised in that the insulated gate structure is used as a mask while introducing said conductivity type dopant into the regions of the silicon film between the source and drain electrode pattern and the respective source and drain silicide parts.

4. A method as claimed in claim 3, further characterised in that ions of said conductivity type dopant are implanted through the silicide-forming metal between steps (d) and (e).

5. A method as claimed in claim 3, further characterised in that ions of said conductivity type dopant are implanted through the source and drain suicide parts after removing the unreacted metal after step (e).

6. A method as claimed in claim 2, further characterised in that the regions of the silicon film between the source and drain electrode pattern and the respective source and drain silicide parts are doped with the conductivity type dopant from the source and drain electrode pattern.

7. A method as claimed in claim 1, further characterised in that the source and drain electrode pattern is exposed at ends of the transistor body, and the source and drain silicide parts extend over these ends to contact the source and drain electrode pattern and so to form at least a part of the electrical connection across the thickness of the silicon film.

8. A method as claimed in claim 7, further characterised in that the ends of the transistor body are tapered, and the source and drain silicide parts extend over these tapered ends.

9. A method as claimed in claim 1, further characterised in that the insulated gate structure is formed on the channel area with a lateral spacing between the conductive gate and the source and drain electrode pattern.

10. A method as claimed in preceding claim 1, further characterised in that a plurality of the transistors are formed on the substrate as switching elements in a device matrix.

11. A method as claimed in claim 2, further characterized in that the source and drain electrode pattern is exposed at ends of the transistor body, and the source and drain silicide parts extend over these ends to contact the source and drain electrode pattern and so to form at least a part of the electrical connection across the thickness of the silicon film.

12. A method as claimed in claim 3, further characterized in that the source and drain electrode pattern is exposed at ends of the transistor body, and the source and drain silicide parts extend over these ends to contact the source and drain electrode pattern and so to form at least a part of the electrical connection across the thickness of the silicon film.

13. A method as claimed in claim 4, further characterized in that the source and drain electrode pattern is exposed at ends of the transistor body, and the source and drain silicide parts extend over these ends to contact the source and drain electrode pattern and so to form at least a part of the electrical connection across the thickness of the silicon film.

14. A method as claimed in claim 5, further characterized in that the source and drain electrode pattern is exposed at ends of the transistor body, and the source and drain silicide parts extend over these ends to contact the source and drain electrode pattern and so to form at least a part of the electrical connection across the thickness of the silicon film.

* * * * *